United States Patent [19]

Minahan et al.

[11] Patent Number: 4,610,077
[45] Date of Patent: Sep. 9, 1986

[54] PROCESS FOR FABRICATING A WRAPAROUND CONTACT SOLAR CELL

[75] Inventors: Joseph A. Minahan, Simi Valley; Eugene L. Ralph, San Gabriel; Hans G. Dill, Newhall, all of Calif.

[73] Assignee: Hughes Aircraft Company, Los Angeles, Calif.

[21] Appl. No.: 605,319

[22] Filed: Apr. 30, 1984

[51] Int. Cl.$^4$ .............................................. H01L 31/18
[52] U.S. Cl. .................................... 29/572; 136/256; 29/591; 29/583
[58] Field of Search .................. 29/572, 578, 583, 591; 136/244, 256; 357/30, 68

[56] References Cited

U.S. PATENT DOCUMENTS 3,411,952 11/1968 Ross et al. ........................... 136/244
3,493,822 2/1970 Iles ..................................... 136/256
4,361,950 12/1982 Amick ................................. 29/572

Primary Examiner—Aaron Weisstuch
Attorney, Agent, or Firm—Paul M. Coble; A. W. Karambelas; Kenneth W. Float

[57] ABSTRACT

We disclose and claim a process for fabricating wraparound solar cells wherein vertical slots are scribed in a semiconductor wafer to initially define the lateral dimensions of the cell. Thereafter, photolithographic masking, etching and diffusion steps are used to define the geometry of a p-n junction of the cell. Then, using lift-off photolithography and a multiple-element metal deposition process, the solar cell grid lines are formed on one surface of the cell and p- and n-type metal contacts are extended around to the opposite surface of the cell. In this manner, the dimensions of the cell can be made less than the diameter of the semiconductor wafer from which it is made.

7 Claims, 12 Drawing Figures

PROCESS FOR FABRICATING A WRAPAROUND CONTACT SOLAR CELL

FIELD OF THE INVENTION

This invention relates generally to the fabrication of semiconductor solar cells with wraparound electrodes and, more particularly, to a method for improving the flexibility of processing silicon wafers of varying diameters in order to provide solar cells of many desired preselected dimensions regardless of the wafer diameter.

BACKGROUND

One well-known process used to interconnect silicon solar cells in order to provide cell arrays of a desired current and voltage capability involves the use of over-and-under contacts of a generally Z-shaped configuration. These contacts are used to connect the backside of one cell to the topside of another adjacent cell in order to interconnect the individual cells in series and/or parallel and thereby provide a required power generating capability for a particular solar panel.

As space and packing density requirements became more stringent in certain solar panel applications, e.g. on spacecraft, some solar cell manufacturers replaced the above over-and-under electrical interconnection technique with a so-called "wraparound" electrical interconnect configuration. Generally speaking, this wraparound approach will initially use conventional photolithographic masking, etching, and p-n junction forming steps to configure a p-n junction in a silicon wafer or substrate to a desired geometry and then make electrical contacts to each side of the p-n junction in such a manner as to extend both contacts "around" to a region adjacent one surface of the semiconductor substrate. This approach normally meant "wrapping" one of the p- or n-type contacts for the solar cell from one surface of the substrate around to the reverse side of the cell substrate where it was extended to a position adjacent the other contact. Using this approach, the individual silicon cells could then be spaced more closely to each other than they could have been spaced using the former over-and-under interconnect scheme. One such wraparound interconnection is described, for example, in U.S. Pat. No. 4,361,950, issued Dec. 7, 1982 to J. A. Amick and entitled "Method of Making Solar Cell With Wrap-Around Electrode".

It was conventional in such practice to employ an entire circular wafer and to process it in accordance with the above steps, and including wrapping a conductor from the front major surface around the edge of the wafer to the rear major surface so that the electrical contacts can be made at the back. Wafers are generally circular and provide poor surface efficiency. In order to improve the surface efficiency, after the processing the wafer edges have been cut off to result in a substantially square solar cell. However, in this trimming part of the original circumferential edge of the original wafer was left so that the corners of the square were cut off by a circular arc. These corners thus maintain the contact from front to back and the almost-square cells improve surface efficiency as compared to circular solar cells.

For many years, solar cell manufacturers have been working mostly with and processing three inch diameter silicon wafers and have thus committed many of their manufacturing lines to the fabrication of solar cells which are approximately three inches from corner to corner. These dimensions are used in order to minimize material waste when cutting the solar cells from three inch diameter wafers. Thus, most solar cell manufacturers have invested substantial sums of money in building and maintaining production lines for making conventional three inch dimension silicon solar cells.

More recently, however, these silicon wafer manufacturers have been growing four inch and larger diameter crystal ingots as a result of various technical breakthroughs in the crystal growth arts. If 4 inch wafers are run on a 3 inch production line, everything operates in a correct way until the wafers are cut square. When a 4 inch wafer is cut square, the entire original circumferential surface having the wraparound interconnection is cut off so that such cells are inoperative. Thus, the change from 3 inch diameter to 4 inch diameter circular wafers presents problems on present solar cell production lines. This change means that future solar cell production lines should now be equipped not only to handle these larger diameter wafers, but they should also still be capable of providing some quantity of the standard three inch dimension solar cells, which are still a preferred dimension cell by many manufacturers of silicon solar panels.

In processing the three inch diameter silicon wafers to form the corresponding three inch by three inch dimension solar cells, one practice has been to dice the wafers on four sides of a square whose corners extend geometrically just beyond the periphery of the cylindrical silicon wafer. In this manner, each silicon die is configured by four adjacent perpendicular edges, each interconnected by a short arcuate section once forming the edge of the cylindrical wafer. These dice are then appropriately masked for diffusion so as to define a desired p-n junction geometry and then loaded into a diffusion furnace where a p-n junction is formed. Thereafter, the dice are further processed using conventional photolithography and dielectric layer forming steps in preparation for subsequent wraparound metallization steps.

Using processes of the above type known in the art, the p-n junction could be extended from one side of the cell to the reverse side for receiving both the p and n type contacts on the same side of the wafer. Or in the case of a planar p-n junction geometry, the metallization was wrapped from one side of the cell to the other. In either case involving the processing of three inch diameter wafers, one edge of the wafer ultimately formed one edge of the solar cell, so that this edge was conveniently exposed for either the p-n junction wraparound steps or the metallization wraparound steps.

On the other hand, if larger diameter, e.g., four inch, wafers were used in the solar cell fabrication process, the above prior art processes could not be used to form individual three inch-by-three inch solar cells or cells with other dimensions smaller than the diameter of the four inch or larger diameter silicon wafer from which the cell is fabricated. Thus, these prior art processes are of limited utility in the larger diameter wafer processing lines in that the ultimate dimensions of the solar cell are always determined by the wafer diameter. It is the solution to this latter problem to which the present invention is directed.

THE INVENTION

The general purpose of this invention is to provide a new and improved process for fabricating wraparound solar cells. This process may be used to fabricate cells of any desired dimension up to and including the diameter of the semiconductor wafer from which the cell is fabricated. Additionally, the present process may be used to form solar cells with various x and y side dimensions for use in particular solar panel applications.

To accomplish this purpose, we have developed a novel solar cell fabrication process which includes forming vertical openings through a semiconductor wafer and spaced apart by the desired lateral dimensions of the solar cell. These openings are provided by cutting slots vertically through the wafer from one major surface thereof to the other, such as by laser scribing, and then etching the slots to provide a smooth surface for these openings and remove any damage to the crystal.

Next, a p-n junction is formed in the portion of the wafer between these openings, and thereafter separate metal contacts are provided on both sides of the p-n junction and are extended around to a common side of the wafer where they are available for making electrical connection to other elements of a solar panel. Thus, the present method enables the fabrication of a wraparound solar cell whose largest dimension is less than the diameter of the semiconductor wafer from which it is cut. In addition, this approach enables the fabrication of various sized wraparound cells on the larger, e.g. four inch diameter, standard size silicon wafers now commercially available, while simultaneously maintaining a round wafer configuration throughout all of the wafer processing steps.

The above purpose and other objects, advantages and novel features of this invention will become more readily apparent from the following description of the accompanying drawings wherein:

DRAWINGS

FIG. 1b is a cross-sectional view taken along lines b—b of FIG. 1a.

FIGS. 1c through 1k, respectively, illustrate schematically-one process for wrapping a p- or n-type solar cell contact around to one side of the silicon substrate in accordance with one embodiment of the present invention.

Figure 2:
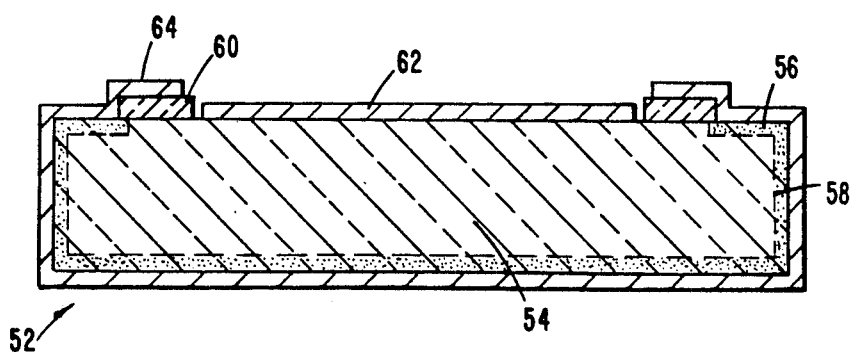

FIG. 2 illustrates a solar cell made by an alternative wraparound process wherein the p-n junction, rather than the contact metallization, is wrapped from one side of the semiconductor substrate to the other in accordance with another, alternative embodiment of this invention.

DESCRIPTION OF PREFERRED EMBODIMENTS

Figure 1A:
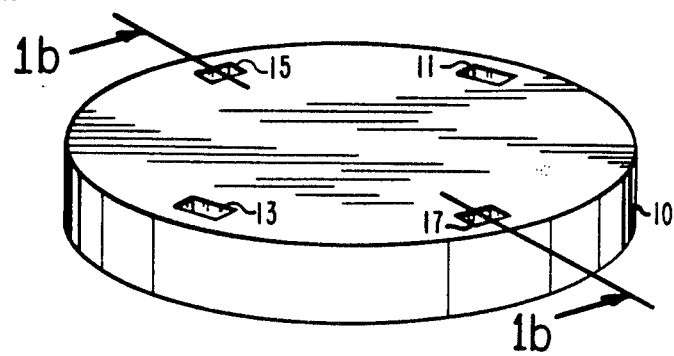
FIG. 1a is a three-dimensional view of a silicon wafer which has been scribed to form openings therein in accordance with the process of this invention.

Referring now to the accompanying drawings, there is shown in FIG. 1a, in perspective view, a four inch diameter silicon wafer 10 which has been laser scribed to form openings 11, 13, 15, and 17 at the selected 90° spaced positions indicated. Conventional state-of-the-art laser scribing techniques may be used to form these openings 11, 13, 15, and 17, and a neodymium(Nd)-yttrium aluminum garnet (YAG) or (Nd:YAG) laser scriber operable in the manual mode has been found quite useful for cutting the slots 12, 14, 16, and 18 as shown. However, other alternative means for providing these openings may be used and include, for example, cavitation, saw, or sandblasting methods available in the silicon wafer processing art.

Following the laser scribe step noted above, the open slots 11, 13, 15, and 17 are etched to provide a smooth surface and to remove crystal damage generated by the laser scribing. The actual size and exact location of these slots 11, 13, 15, and 17 are determined by cell size, fracture planes, current flow and contact design for a given cell. As will be seen in the following description, the present process may be used, for example, to fabricate standard size 2.5 inch×2.5 inch cells and standard size 3.0 inch×3.0 inch cells from four and five inch diameter wafer lines, respectively.

Figure 1B:
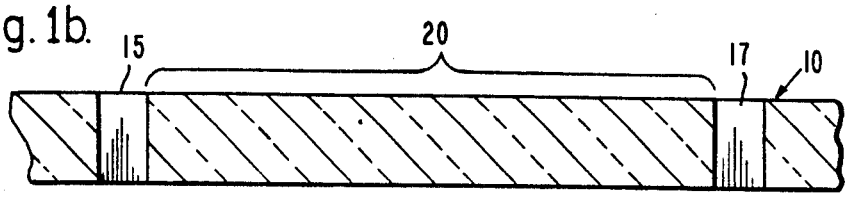

Referring now successively to FIGS. 1b–1k, there are shown schematically a series of wafer processing steps utilized to fabricate solar cells in accordance with one embodiment of the present invention. FIG. 1b is a cross-sectional view taken along lines b—b of FIG. 1a and includes the central or main substrate 20 portion of the wafer 10 which is typically about 10 mils in thickness.

The p-type silicon wafer or substrate 10 in FIG. 1b is transferred to a low temperature chemical vapor deposition (CVD) station (not shown) where a thin layer 12 of silicon dioxide, $SiO_2$, is deposited over the entire surface of the wafer 10 to a thickness typically on the order of 10,000 Å. Low temperature chemical deposition processes used for forming these thin oxide layers are generally well known in the art and are discussed, for example, in Part 3 of *Thin Film Processes* by Vossen and Kern, Academic Press, New York, 1978 at pages 258–320.

Figure 1C:
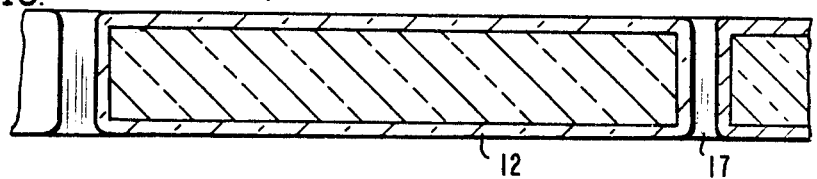
Figure 1D:
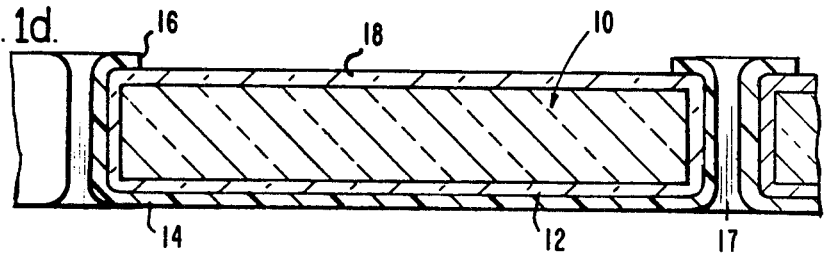
Figure 1E:
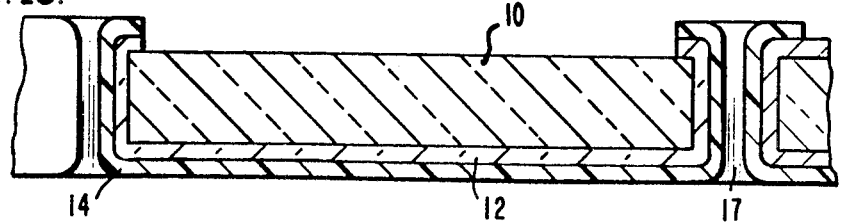

Next, the structure of FIG. 1c is transferred to a conventional photoresist deposition and mask forming station (not shown) where an outer photoresist mask 14 is formed in the geometry shown in FIG. 1d and having an opening 16 therein which exposes substantially the entire uppermost oxide layer 18 on the substrate 10. The formation of photoresist masks, such as the mask 14, is well known in the art, and such masks are described, for example, by William S. DeForest in *Photoresist: Materials and Processes*, McGraw-Hill, 1975. Once the photoresist mask 14 is in place as shown in FIG. 1d, a suitable etchant such as dilute hydrofluoric acid, HF, is applied to the exposed portion 18 of the $SiO_2$ layer 12 to remove this portion from the upper surface of the substrate 10. Thereafter, a suitable solvent is applied to the structure shown in FIG. 1e to remove the remaining photoresist mask 14, leaving intact the oxide diffusion mask 12 as shown.

Figure 1F:
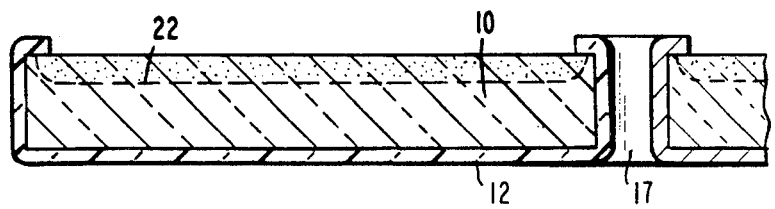

Next, the structure of FIG. 1f is transferred to a suitable diffusion furnace (not shown) where an n-type diffusion is carried out using phosphine gas, $PH_3$, at approximately 800° C. and a nitrogen carrier to thereby produce a shallow p-n junction 22 on the order of 0.15 to 0.2 microns in junction depth. As is known in the art, the depth of the p-n junction 22 is related to the collection efficiency of the solar cell. A discussion of this relationship may be found, for example, in *Fundamentals of Solar Cells: Photovoltaic Solar Energy Conversion* by Allen L. Fahrenbruch and Richard H. Bube, New York Academic Press, 1983. Diffused p-n junctions are also described in *Physics and Technology of Semiconductor Devices* by A. S. Grove, John Wiley and Sons, 1967.

Figure 1G:
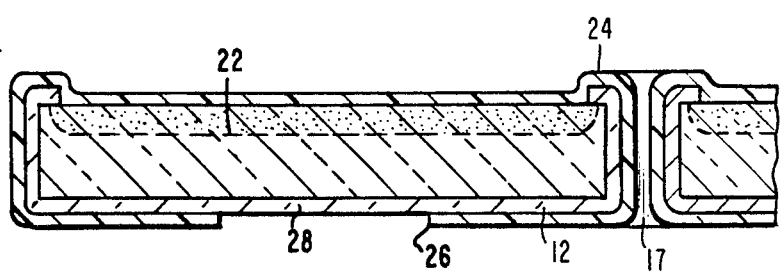

With the p-n junction 22 in place as shown in FIG. 1f, the structure of FIG. 1f and again transferred to a photoresist mask deposition station where another photoresist mask 24 is deposited in the geometry shown in FIG. 1g and having an opening 26 therein exposing a portion 28 of the lower layer of silicon dioxide 12. With the photoresist layer 24 in place as shown in FIG. 1g, a dilute hydrofluoric acid etchant solution is applied to the SiO₂ region 28 to remove the same and thereby expose a lower surface area 30 of the substrate 10 as shown in FIG. 1h.

Figure 1H:
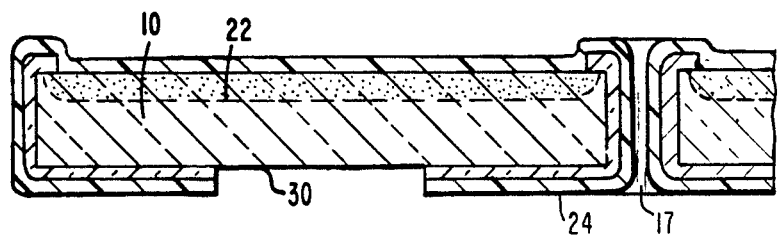
Figure 1I:
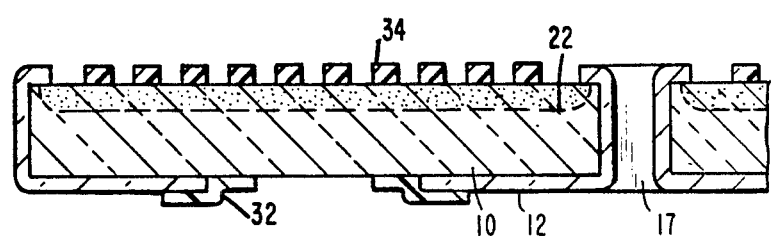

With the lower substrate surface 30 thus exposed as shown in FIG. 1h, the photoresist mask 24 is removed using a suitable solvent etch solution, and then another photoresist mask 32 is formed in the locations shown in FIG. 1i on the lower surface of the structure being processed. Then, yet another photoresist mask 34 is formed on the upper surface of the wafer 10 in the form of long thin strips which are utilized to ultimately define the width and spacing of the metal collection grid to be formed on the upper surface of the silicon substrate 10.

Figure 1J:
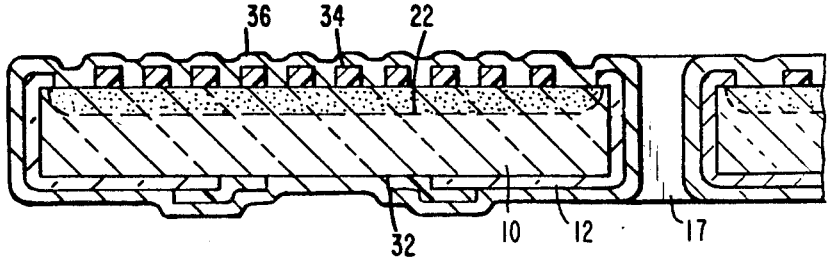
Figure 1K:
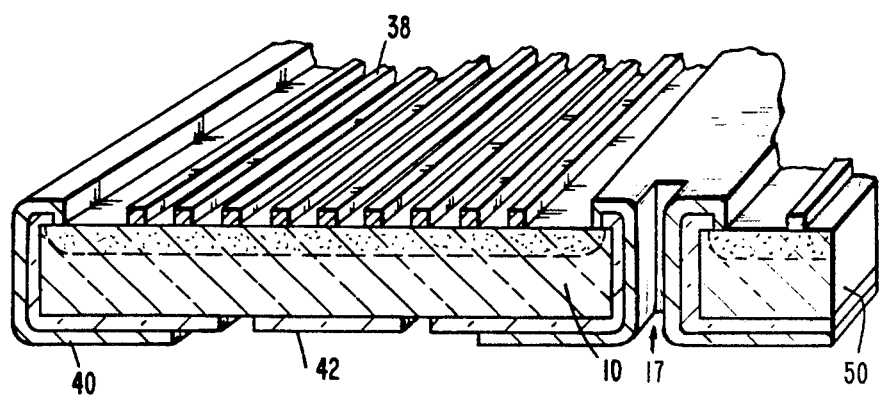

With the photoresist mask shown in FIG. 1i firmly in place, the structure of FIG. 1i is transferred to a suitable multilayer metal deposition station (not shown) where a thin multilayer metal film 36 is deposited on both sides of the masked structure of FIG. 1i to form the metallized structure of FIG. 1j. Then, using conventional photoresist liftoff techniques, the photoresist mask of FIG. 1j is removed using a suitable soak solvent etchant to thereby carry away portions of the metallization 36 lying thereover. This step leaves intact portions of the metallization shown in FIG. 1k which did not cover a photoresist island and which were in direct and secure contact with surfaces of the silicon or silicon dioxide, as shown in FIG. 1k. After completion of the processing, the wafer with its functional layers is cut to size. In FIG. 1k, the cut surface 50 represents the exterior periphery of the cell after cutting. The surface 50 represents a cut line which may lie in line with one of the openings 11, 13, 15 or 17 or may be outside of one or more of the openings.

The thin grid lines 38 of the completed-solar cell structure of FIG. 1k are preferably titanium-palladium-silver, with titanium being the initial or surface layer of about 500 angstroms in thickness, the palladium being the next or inner layer of approximately 800 angstroms in thickness, and the upper layer being silver of about 5 microns in thickness. The wraparound contact 40 and the back surface contact 42 for the solar cell are preferably aluminum-titanium-palladium-silver, with the titanium-palladium-silver being identical to the composition of the grid lines 38, and with an added inner layer of aluminum of a thickness of about 1 micron. For a further discussion of multiple element metallization systems of the above type, reference may be made to Fischer and Gereth, *Transactions on Electron Devices*, Vol. ED-18, No. 8, Aug. 1971, page 457. The thin collection grid lines are typically about 0.2 mils in thickness, about 1.0 mil wide, and have a center-to-center spacing of about 40 mils. These thin grid lines are joined to a common bus line (not shown) located on the upper back surface of the cell, and they are also connected to the wraparound contact 40 as accomplished by the design of the photoresist pattern.

Advantageously, the production of the above multi-element metallization compositions used to form the solar cell grid lines and p- and n-type region contacts may be formed using a planetary ion bombardment system. In this sytem, sources of aluminum, silver, titanium and palladium are spaced at predetermined locations in an enclosed sputtering chamber which is operated in an accelerating field. The above metal sources are rotated and bombarded with ions accelerated in the controlled magnetic field in order to sputter the desired amounts of these four metal elements onto the masked structure of FIG. 1i, which is also mounted in a predetermined spaced relationship to the rotating planetary metal sources.

Referring now to FIG. 2, there is shown a solar cell structure designated generally 52 and having a central p-type region 54 partially surrounded by an outer n-type region 56 which itself has been "wrapped around" the substrate in the geometry shown using conventional photolithographic masking, etching, and diffusion techniques to form the p-n junction 58. The p-n junction 58 terminates as shown at the upper surface of the structure and beneath a dielectric isolation and junction passivation island 60 of silicon dioxide. This SiO₂ island 60 is also formed using standard photolithographic masking, etching and oxide formation techniques which are well known in the art.

Using conventional photoresist spin-on and selective lift-off techniques to define the contact metallization patterns in a manner described above, the base and emitter ohmic contacts 62 and 64 are delineated as shown in FIG. 2. The emitter contact 64 is wrapped from the lower or bottom surface of the solar cell 52 around to the top surface where it terminates at a location adjacent the base contact 62 to facilitate bonding these contacts 62 and 64 to a common solar cell support member. In the embodiment shown in FIG. 2, the individual grid lines are not shown but are formed on the lower surface of the structure in a manner similar to that described above with reference to FIGS. 1i, j, and k.

Various modifications may be made to the above-described embodiments without departing from the scope of this inveniton. For example, the solar cells fabricated by the present process may be of varying sizes and shapes other than square or rectanglular as determined by the locations of the laser scribe openings of FIG. 1a. Additionally, one or more of these openings may be formed in a central or other non-peripheral location on the wafer in order to provide the vertical wall exposure of the wafer necessary for wrapping either the p or n contact or the p-n junction from one side of the wafer to the other.

What is claimed is:

1. A process for fabricating a wraparound contact solar cell comprising:
   (a) providing a silicon substrate of a chosen size and shape having first and second opposed major surfaces,
   (b) forming openings in said substrate and extending through said substrate from said first major surface thereof to said second major surface and spaced apart by a desired lateral dimension of a solar cell,
   (c) processing said substrate to form a p-n junction therein and between said openings, whereby the vertical walls of said substrate defining said openings are exposed for oxidation, photolithography, and junction-forming steps,
   (d) utilizing these steps in paragrah (c) above to also form p-region and n-region contacts on the major surfaces of said substrate and extending to a single one of said first and second major surfaces thereof through said openings where they are electrically isolated for bonding to a common solar cell support member, and
   (e) forming grid lines on one major surface of said substrate for interconnection to one of said p- or n-region contacts for deriving a solar cell output voltage resulting from charge carriers generated at said p-n junction.

2. The process defined in claim 1 wherein said p-n junction is formed in a plane parallel to one major surface of said semiconductor substrate, and photolithographic masking, etching, and metallization steps are utilized to wrap metallization from one major surface of the substrate through said openings to the other major surface to thereby make contacts to each side of said p-n junction.

3. The process defined in claim 1 wherein photolithographic masking, etching, and junction forming steps are utilized to wrap said p-n junction from one major surface said substrate to the other major surface and thereafter metal pattern forming steps are utilized to deposit contacts on opposite sides of said p-n junction adjacent one major surface of said substrate.

4. The process defined in claim 1 further including the step of cutting said substrate through from one major surface to the other to define the outline shape of the solar cell so that connection between said surfaces extends through said openings.

5. A process for fabricating a wraparound contact solar cell comprising:
 (a) providing a silicon substrate of a chosen size and shape, said silicon substrate having first and second opposed major surfaces;
 (b) forming at least one opening in said substrate, said opening extending through said substrate from said first to said second major surface of said substrate;
 (c) processing said substrate to form a p-n junction therein;
 (d) utilizing masking, oxidations, and deposition steps to form p-region and n-region contacts on the major surfaces of said substrate, at least one of said contacts extending through said opening between said surfaces to that said p-region and n-region contacts are positioned on a single one of said first and second major surfaces where they are electrically isolated from each other;
 (e) forming grid lines on one major surface of said substrate for interconnection to one of said p-or n-region contacts for deriving a solar cell output voltage resulting from charge carriers generated at said p-n junction, and
 (f) cutting said substrate to a desired size and shape so that electrical continuity is maintained through said opening.

6. The process defined in claim 5 wherein said p-n junction is formed in a plane parallel to one said major surface of said semiconductor substrate, and photolithographic masking, etching, and metallization steps are utilized to wrap metallization from one major surface of the substrate between said openings to the other major surface to thereby make contacts to each side of said p-n junction.

7. The process defined in claim 6 wherein photolithographic masking, etching, and junction forming steps are utilized to wrap said p-n junction from one major surface of said substrate to the other major surface, and thereafter metal pattern forming steps are utilized to deposit contacts on opposite sides of said p-n junction adjacent one major surface of said substrate.

* * * * *

UNITED STATES PATENT AND TRADEMARK OFFICE
CERTIFICATE OF CORRECTION

PATENT NO. : 4,610,077

DATED : September 9, 1986

INVENTOR(S) : JOSEPH A. MINAHAN, EUGENE L. RALPH, HANS G. DILL

It is certified that error appears in the above-identified patent and that said Letters Patent is hereby corrected as shown below:

Column 3, line 66, "12, 14, 16, 18" should read "11, 13, 15, 17"

Signed and Sealed this

Twenty-third Day of December, 1986

Attest:

DONALD J. QUIGG

*Attesting Officer*  *Commissioner of Patents and Trademarks*

REEXAMINATION CERTIFICATE (855th)
United States Patent [19]
Minahan et al.

[11] B1 4,610,077

[45] Certificate Issued May 3, 1988

[54] PROCESS FOR FABRICATING A WRAPAROUND CONTACT SOLAR CELL

[75] Inventors: Joseph A. Minahan, Simi Valley; Eugene L. Ralph, San Gabriel; Hans G. Dill, Newhall, all of Calif.

[73] Assignee: Hughes Aircraft Company, Los Angeles, Calif.

Reexamination Request:
No. 90/001,307, Aug. 17, 1987

Reexamination Certificate for:
Patent No.: 4,610,077
Issued: Sep. 9, 1986
Appl. No.: 605,319
Filed: Apr. 30, 1984

Certificate of Correction issued Dec. 23, 1986.

[51] Int. Cl.⁴ .................................... H01L 31/18
[52] U.S. Cl. ......................................... 437/2; 136/256; 437/197; 437/201
[58] Field of Search .................. 437/2, 180, 203; 136/256; 357/30 J, 30 Q, 68

[56] References Cited
U.S. PATENT DOCUMENTS 3,903,427  9/1975  Pack .................................. 250/578
3,903,428  9/1975  DeJong .............................. 250/578

OTHER PUBLICATIONS

Giuliano and Wohlgemuth, "Advanced Cell Designs for Welded Arrays", *Proceedings of the IECEC* (17th Inter Society Energy Conversion Engineering Conference), vol. 3, pp. 1627-1630 (1982).

*Primary Examiner*—Aaron Weisstuch

[57] ABSTRACT

We disclose and claim a process for fabricating wraparound solar cells wherein vertical slots are scribed in a semiconductor wafer to initially define the lateral dimensions of the cell. Thereafter, photolithographic masking, etching and diffusion steps are used to define the geometry of a p-n junction of the cell. Then, using lift-off photolithography and a multiple-element metal deposition process, the solar cell grid lines are formed on one surface of the cell and p- and n-type metal contacts are extended around to the opposite surface of the cell. In this manner, the dimensions of the cell can be made less than the diameter of the semiconductor wafer from which it is made.

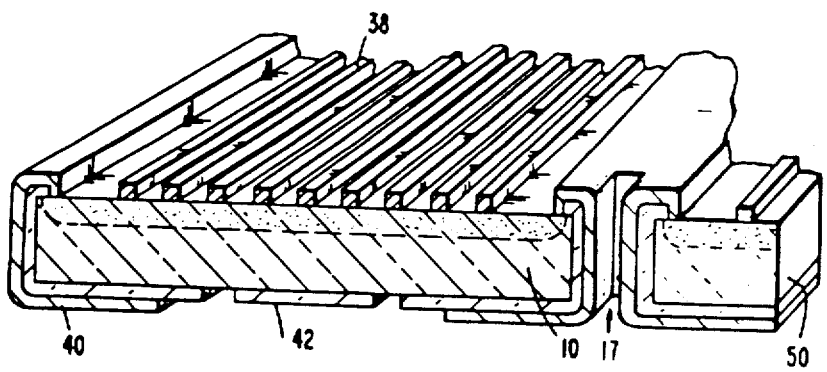

REEXAMINATION CERTIFICATE ISSUED UNDER 35 U.S.C. 307

THE PATENT IS HEREBY AMENDED AS INDICATED BELOW.

Matter enclosed in heavy brackets [ ] appeared in the patent, but has been deleted and is no longer a part of the patent; matter printed in italics indicates additions made to the patent.

AS A RESULT OF REEXAMINATION, IT HAS BEEN DETERMINED THAT:

Claims 1-7 are cancelled.

* * * * *